(12) United States Patent
Li

(10) Patent No.: US 10,304,922 B2
(45) Date of Patent: May 28, 2019

(54) ARRAY SUBSTRATE AND WEARABLE DEVICE

(71) Applicant: BOE TECHNOLOGY GROUP CO., LTD., Beijing (CN)

(72) Inventor: Wenbo Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/539,272

(22) PCT Filed: Jan. 29, 2016

(86) PCT No.: PCT/CN2016/072708
§ 371 (c)(1),
(2) Date: Jun. 23, 2017

(87) PCT Pub. No.: WO2017/041423
PCT Pub. Date: Mar. 16, 2017

(65) Prior Publication Data
US 2018/0331122 A1 Nov. 15, 2018

(30) Foreign Application Priority Data
Sep. 7, 2015 (CN) .......................... 2015 1 0563962

(51) Int. Cl.
*H01L 27/32* (2006.01)
*H01L 23/02* (2006.01)
(Continued)

(52) U.S. Cl.
CPC ........ *H01L 27/3288* (2013.01); *G02F 1/1362* (2013.01); *G06F 1/163* (2013.01);
(Continued)

(58) Field of Classification Search
CPC ......... G06F 1/163; H01L 23/00; H01L 23/02; H01L 23/12; H01L 23/28; H01L 23/32;
(Continued)

(56) References Cited

U.S. PATENT DOCUMENTS 8,477,250 B2 7/2013 Schellingerhout et al.
2009/0213293 A1* 8/2009 Sekiguchi ......... G02F 1/133608
349/58

(Continued)

FOREIGN PATENT DOCUMENTS

CN 101443695 A 5/2009
CN 203012296 U 6/2013
(Continued)

OTHER PUBLICATIONS

International Search Report of PCT/CN2016/072708 in Chinese, dated Jun. 15, 2016 with English translation.
(Continued)

*Primary Examiner* — Eduardo A Rodela
(74) *Attorney, Agent, or Firm* — Collard & Roe, P.C.

(57) ABSTRACT

An array substrate and a wearable device are provided. The array substrate includes a base substrate. A first surface of the base substrate is provided with a plurality of first signal lines having a concentric arc shape and a plurality of second signal lines linearly arranged along a radial direction of the first signal lines. A first driving circuit connected to the respective first signal lines is provided on the first surface or a second surface of the base substrate and a second driving circuit connected to the respective second signal lines is provided on the first surface or a second surface of the base substrate. In the array substrate, since the first driving circuit and the second driving circuit are both positioned within a display region, the screen proportion of the display region is (Continued)

improved, thereby achieving a narrow bezel design or even bezel-free design for the wearable device.

20 Claims, 3 Drawing Sheets

(51) Int. Cl.
  *H01L 23/13* (2006.01)
  *H01L 23/12* (2006.01)
  *H01L 23/10* (2006.01)
  *H01L 23/04* (2006.01)
  *G02F 1/1362* (2006.01)
  *G09F 9/30* (2006.01)
  *G06F 1/16* (2006.01)
  *G09G 3/20* (2006.01)
  *H01L 27/12* (2006.01)

(52) U.S. Cl.
  CPC .............. *G09F 9/30* (2013.01); *G09G 3/20* (2013.01); *H01L 23/02* (2013.01); *H01L 23/04* (2013.01); *H01L 23/10* (2013.01); *H01L 23/12* (2013.01); *H01L 23/13* (2013.01); *H01L 27/124* (2013.01); *H01L 27/1218* (2013.01); *H01L 27/32* (2013.01)

(58) Field of Classification Search
  CPC ..... H01L 23/48; H01L 23/498; H01L 23/528; H01L 23/5386; H01L 23/58
  See application file for complete search history.

(56) References Cited

U.S. PATENT DOCUMENTS

| | | | | |
|---|---|---|---|---|
| 2012/0212922 | A1* | 8/2012 | Schneider | G06F 1/163 361/807 |
| 2014/0267968 | A1 | 9/2014 | Haga et al. | |
| 2014/0354596 | A1* | 12/2014 | Djordjev | G06K 9/0002 345/175 |
| 2016/0071451 | A1* | 3/2016 | Yang | G09G 3/2092 345/204 |
| 2016/0291378 | A1 | 10/2016 | Li et al. | |

FOREIGN PATENT DOCUMENTS

| | | |
|---|---|---|
| CN | 103424901 A | 12/2013 |
| CN | 103487962 A | 1/2014 |
| CN | 204303315 U | 4/2015 |
| CN | 204303316 U | 4/2015 |
| CN | 105047088 A | 11/2015 |
| CN | 105137684 A | 12/2015 |
| CN | 204926689 U | 12/2015 |
| CN | 105487314 A | 4/2016 |
| JP | 2007-114569 A | 5/2007 |
| TW | 201035938 A | 10/2010 |

OTHER PUBLICATIONS

Notice of Transmittal of the International Search Report of PCT/CN2016/072708 in Chinese, dated Jun. 15, 2016.
Written Opinion of the International Searching Authority of PCT/CN2016/072708 in Chinese, dated Jun. 15, 2016 with English translation.
Chinese Office Action in Chinese Application No. 201510563962.2, dated Mar. 20, 2017 with English translation.

* cited by examiner

ARRAY SUBSTRATE AND WEARABLE DEVICE

CROSS REFERENCE TO RELATED APPLICATIONS

This application is the National Stage of PCT/CN2016/072708 filed on Jan. 29, 2016, which claims priority under 35 U.S.C. § 119 of Chinese Application No. 201510563962.2 filed on Sep. 7, 2015, the disclosure of which is incorporated by reference.

TECHNICAL FIELD

Embodiments of the present disclosure relate to an array substrate and a wearable device.

BACKGROUND

With the development of intelligent wearable technology, smart watches with display function have been favored. Smart watches are expected to display as much as possible. As the dial area cannot be very large, it becomes a very important development aspect for smart watches to increase screen proportion.

However, a display screen of a smart watch inevitably requires a driving circuit and a peripheral driving circuit, which typically occupy a non-display region at peripheries of the array substrate, so that the screen proportion of the display screen is limited. In order to improve the screen proportion of the smart watch, a display screen having a narrow bezel or even no bazel is required.

SUMMARY

At least one embodiment of the present disclosure provides an array substrate, comprising a base substrate, a plurality of first signal lines of a concentric arc shape and a plurality of second signal lines linearly arranged along a radial direction of the first signal lines, wherein the plurality of first signal lines and the plurality of second signal lines are provided on a first surface of the base substrate, the array substrate further comprising a first driving circuit connected to the respective first signal lines and a second driving circuit connected to the respective second signal lines, the first driving circuit being provided on the first surface or a second surface of the base substrate, and the second driving circuit being provided on the first surface or the second surface.

In one embodiment of the present disclosure, the array substrate further comprises: a plurality of connecting lines provided on the second surface of the base substrate and corresponding to the respective first signal lines, and a plurality of first vias penetrating the base substrate and corresponding to the respective connecting lines, the first driving circuit disposed on the second surface of the base substrate and electrically connected to the first signal lines through the respective connecting lines passing through the first vias.

In one embodiment of the present disclosure, an auxiliary circle which is capable of intersecting all of the first signal lines is formed by taking a center of the first driving circuit as a center of the auxiliary circle, and the first vias are disposed in at least one intersection position between the auxiliary circle and the first signal lines.

In one embodiment of the present disclosure, there are two intersection points between each of the first signal lines and the auxiliary circle, and the first vias are provided in both positions of the two intersection points.

In one embodiment of the present disclosure, the first driving circuit has an outer profile of circular, a spacing between adjacent two of the plurality of first signal lines is identical, and an included angle between adjacent two of the plurality of second signal lines is identical.

In one embodiment of the present disclosure, the connecting lines are extended along a radial direction of the auxiliary circle.

In one embodiment of the present disclosure, the second driving circuit is positioned on the first surface, has a circular-shaped outer profile, and is concentric with the first signal lines.

In one embodiment of the present disclosure, the second driving circuit has a circular-shaped outer profile and is disposed on the second surface, a center of the second driving circuit and a center of the first signal lines have projections on the substrate which are overlapped with each other, and the second driving circuit is electrically connected with the plurality of second signal lines through second vias penetrating the base substrate.

In one embodiment of the present disclosure, the second vias are provided at positions where the plurality of second signal lines intersect the second driving circuit.

In one embodiment of the present disclosure, the first driving circuit and the second driving circuit are packaged in Chip On Flex or Chip On Glass.

In one embodiment of the present disclosure, the array substrate further comprises a thin film transistor provided at the respective intersection positions between the first signal lines and the second signal lines on the first surface.

In one embodiment of the present disclosure, the first signal lines are gate lines and the second signal lines are data lines, or first signal lines are data liens and the second signal lines are gate lines.

In one embodiment of the present disclosure, the base substrate is a circular substrate concentric with the plurality of first signal lines.

At least one embodiments of the present disclosure provides a wearable device comprising the array substrate as mentioned above.

At least one embodiments of the present disclosure provides an array substrate and a wearable device, wherein a plurality of first signal lines with a concentric arc shape and a plurality of second signal lines linearly arranged in the radial direction of the first signal lines are provided on the first surface, and the first driving circuit connected with the first signal lines is provided on the first or second surface and the second driving circuit connected with the second signal lines is provided on the first surface or the second surface. As the first driving circuit and the second driving circuit are both positioned within the display region, the screen proportion of the display region is improved, thereby achieving a narrow bezel or even bezel-free design of the wearable device.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

Figure 1:
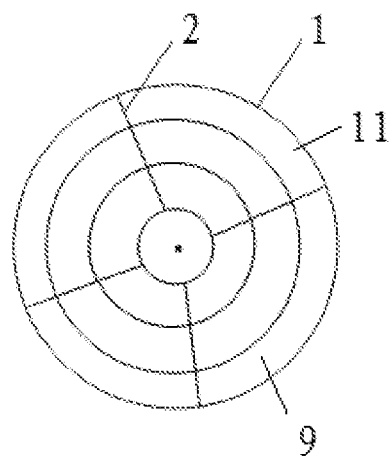
FIG. 1 is an illustrative structural view of a first side of an array substrate according to an embodiment of the present disclosure.

REFERENCE NUMERALS 1. first signal line; 2. second signal line; 3. connecting line; 4. first via; 5. second via; 6. first driving circuit; 7. second driving circuit; 8. auxiliary circle; 9. base substrate; 10. watch dial.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

The embodiments of the present disclosure provide a wiring design for a heterotype of bezel-free array substrate. In the embodiments illustrated hereinafter, a detailed description is made by taking a circular array substrate as an example.

Figure 2:
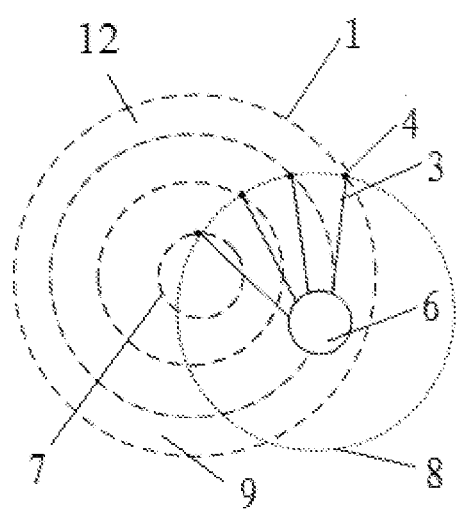
FIG. 2 is an illustrative structural view of a second side of an array substrate according to an embodiment of the present disclosure.

One embodiment of the present disclosure provides an array substrate with reference to FIGS. 1 and 2, which are illustrative top views of a first surface 11 and a second surface 12 of the array substrate respectively. The array substrate comprises a base substrate 9 which comprises the first surface 11 and the second surface 12 (not shown in FIG. 1) opposite to each other. As shown in FIG. 1, a plurality of first signal lines 1 having a concentric arc shape and a plurality of second signal lines 2 linearly arranged in the radial direction of the first signal lines 1 are provided on the first surface 11. As illustrated in FIG. 2, the array substrate further comprises a first driving circuit 6 provided on the first surface 11 or the second surface 12 and connected to the respective first signal lines 1, and a second driving circuit 7 provided on the first surface 11 or the second surface 12 and connected to the respective second signal lines 2.

In FIG. 2, the structure indicated by solid lines is provided on the second surface 12, while the structure indicated by dashed lines is provided on the first surface 11.

In the above-described array substrate, by providing a plurality of first signal lines 1 with a concentric arc shape and a plurality of second signal lines 2 linearly arranged in the radial direction of the first signal lines 1 on the first surface 11 and providing the first driving circuit 6 connected with the first signal lines 1 on the second surface 12 and the second driving circuit 7 connected with the second signal lines 2 on the first surface 11 or the second surface 12, since the first driving circuit 6 and the second driving circuit 7 are both positioned within the display region, the screen proportion (i.e., the ratio of the area of the display region to the area of the whole device or the area of the array substrate) of the display region is improved, thereby achieving a narrow bezel or even bezel-free design of the wearable device.

The first surface 11 and the second surface 12 of the aforementioned base substrate 9 can be understood as a front surface and a rear surface of the base substrate. The material of the base substrate 9 can be a circular glass substrate or a circular flexible PI substrate communicated with the plurality of first signal lines 1.

The first signal lines 1 in the above-described array substrate are gate lines and the second signal lines 2 are data lines. Alternatively, the first signal lines 1 are data lines and the second signal lines 2 are gate lines. Of course, when the first signal lines 1 are gate lines, the first driving circuit 6 connected with the first signal lines 1 is a gate line driving circuit. When the second signal lines 2 are data lines, the second driving circuit 7 connected with the second signal lines 2 is a data line driving circuit. When the first signal lines 1 are data lines, the first driving circuit 6 connected with the first signal lines 1 is a data line driving circuit. When the second signal lines 2 are gate lines, the second driving circuit 7 connected with the second signal lines 2 is a gate line driving circuit.

To facilitate the illustration, hereinafter, the description is made by taking an example in which the first signal lines 1 are data lines and the second signal lines 2 are gate lines. In this case, the first driving circuit 6 electrically connected with the first signal lines 1 is a data line driving circuit which is referred to as Data IC, while the second driving circuit 7 electrically connected with the second signal lines 2 is a gate line driving circuit which is referred to as Gate IC.

To make pixels on the array substrate uniform, an outer profile of the base substrate 9 in the present embodiment is a circular shape concentric with the plurality of first signal lines 1. An array substrate formed by the circular base substrate 9 can be applied to a display device such as a wearable watch. The spaces between the above-described plurality of first signal lines 1 positioned on the first surface 11 of the base substrate 9 are identical. The included angles between the plurality of second signal lines 2 are identical. An extension of each of the second signal lines 2 can pass through the center of the first signal lines, so that the first signal lines 1 and the second signal lines 2 are uniformly distributed on the base substrate 9. With this structure, a pixel structure formed on the array substrate can be a circular pixel or a trapezoidal pixel.

In one embodiment of the present disclosure, as illustrated in FIG. 2, the above-described array substrate further comprises a plurality of connecting lines 3 provided on the second surface 12 of the base substrate 9 and corresponding to the respective first signal lines 1, and a plurality of first vias 4 penetrating the base substrate 9, the respective first vias 4 corresponding to the respective connecting lines 3 one by one. The first driving circuit 6 is provided on the second surface 12 of the base substrate 9 and is electrically connected to the first signal lines 1 through the respective connecting lines 3 which can pass through the first vias 4.

To make the distances from the first driving circuit 6 to the respective connecting lines of the respective first signal lines 1 identical and thus achieve a design in which resistances of the respective connecting lines are identical, positions of the aforementioned first vias 4 can be obtained through the following method: drawing an auxiliary circle by taking an arbitrary point within the outermost first signal line 1 as a center so that the auxiliary circle intersects all of the first signal lines 1. The first via 4 is disposed in at least one intersection position between the auxiliary circle 8 and each of the first signal lines 1, and the center of the auxiliary circle 8 is taken as a center of the first driving circuit 6 which is positioned within the outermost first signal line 1. By the arrangement of the first vias 4, the connecting lines 3 from the center of the first driving circuit 6 to the first vias 4 each becomes a part of radius lines of the auxiliary circle 8, so that the distances from the first driving circuit 6 to the first vias 4 are all equal. An outer profile of the first driving circuit 6 can be circular shape or other shapes. However, in the present embodiment, to make the manufacturing process simple and the distances of the connecting lines 3 from lead wires on the first driving circuit 6 to the first vias 4 are identical, the outer profile of the first driving circuit 6 is designed to be a circular shape, which is not restricted by the present disclosure.

Figure 3:
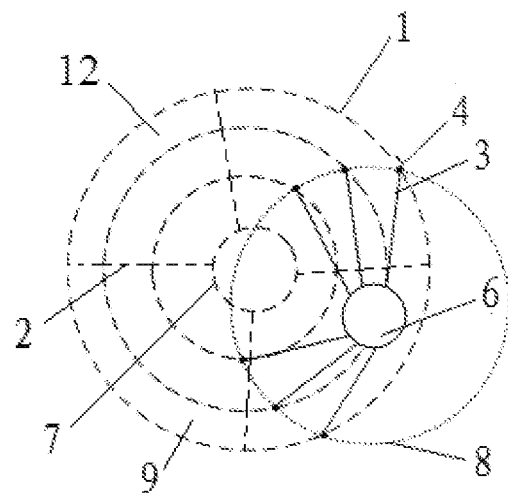
FIG. 3 is an illustrative structural view of a second side of an array substrate according to another embodiment of the present disclosure.

Since in the process of forming the first vias 4 through the above-described method, the auxiliary circle 8 intersects the innermost first signal line 1 or is tangent to the innermost first signal line 1, it can be appreciated that when the auxiliary circle 8 intersects the innermost first signal line 1, there are two intersection points between the auxiliary circle 8 and each of the first signal lines 1 and the first vias 4 are provided at both positions of the two intersection points. Therefore, the first driving circuit 6 can be connected with two intersection points of each of the first signal lines 1 and there are two connecting lines 3 as illustrated in FIG. 3, which reduces the delay of the drive signal and prevents the malfunction caused by the damage of one connecting line 3 by enabling another connecting line 3 to continuously provide the drive signal to the first signal lines 1, thereby improving the yield of the device.

Similar to the first driving circuit 6, an outer profile of the second driving circuit 7 in the present embodiment is a circular shape, and is positioned on the first surface 11 and is concentric with the first signal lines 1. Therefore, each driving lead of the second driving circuit 7 is electrically connected with the second signal lines 2 on the second surface 12 directly and distances from the driving lead to the respective second signal lines 2 are the same.

Figure 4:
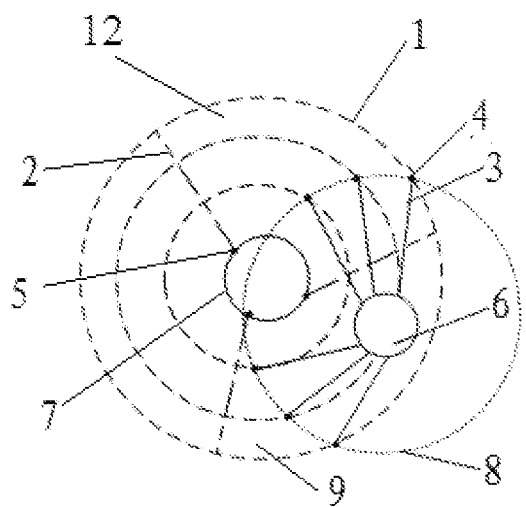
FIG. 4 is an illustrative structural view of a second side of an array substrate according to another embodiment of the present disclosure.

In another embodiment of the present disclosure, as illustrated in FIG. 4, the second driving circuit 7 has a circular-shaped outer profile and is positioned on the second surface 12. Projections of the center of the second driving circuit 7 and the center of the first signal lines 1 coincide with each other. Since the second signal lines 2 are positioned on the first surface 11, the second driving circuit 7 is electrically connected with the plurality of second signal lines 2 through second vias 5 penetrating the base substrate 9. For example, the second vias 5 are provided at positions where the plurality of second signal lines 2 intersect with the second driving circuit 7. Thus, there is no need to provide connecting lines connecting the second driving circuit 7 with the second vias 5, thereby reducing the delay of the drive signal. Moreover, such design structure prevents that the second driving circuit 7 being provided on the second surface 12 leads to an intersection of the connecting lines at the time of driving the second signal lines 2 and the first signal lines 1 through the second driving circuit 7 and the first driving circuit 6, respectively. Thus, the first driving circuit 6, the second driving circuit 7, the first signal lines 1, the second signal lines 2 and the connecting lines 3 of the first driving circuit 6 connected with the first signal lines 1 are all provided within the circular region of the base substrate 9, thereby achieving a bazel-free display. The aforementioned first vias 4 and second vias 5 are both formed through a glass punching process, for example, through laser punching or etching punching.

The array substrate in the above-described embodiments further comprises a thin film transistor, which is disposed at an intersection position between the first signal line 1 and the second signal line 2 on the first surface 11. It can be appreciated that the first signal line 1 and the second signal line 2 are provided at different metallic layers on the first surface 11 of the base substrate 9, and like the first signal line 1 and the second signal line 2, the gate of the thin film transistor and the source/drain of the thin film transistor are provided at different metallic layers respectively. To simplify the process, for example, the gate of the thin film transistor and the first signal line 1 can be provided on the same metallic layer, and the source/drain of the thin film transistor and the second signal line 2 can be provided on the same metallic layer.

In one embodiment of the present disclosure, the first driving circuit 6 and the second driving circuit 7 can be packaged in Chip On Flex (referred to as COF) or Chip On Glass (referred to as COG). Of course, Gate Driver On Array (referred to as GOA) can be used for the second driving circuit. In the present embodiment, in order to reduce the number of processes, the second driving circuit 7 can be provided on the same layer as the second signal line 2 and be electrically connected with the second signal line 2 so as to drive the second signal line 2.

At least one embodiment of the present disclosure further provides a wearable device comprising the array substrate in the above-described embodiments.

The wearable device can be any product or component having a display function such as a watch, a cell phone, a tablet computer, a television, a laptop, a digital photo frame and a navigator and the like.

Figure 5:
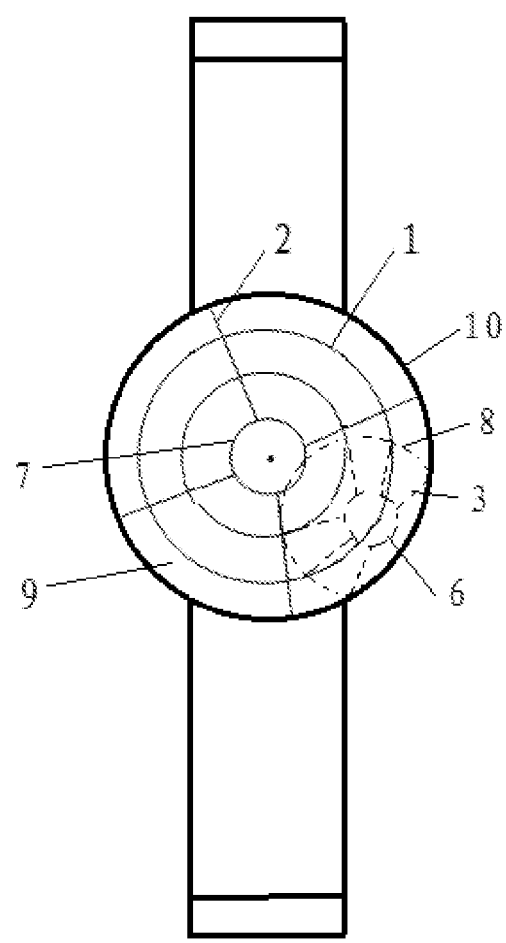
FIG. 5 is an illustrative structural view of a wearable device according to an embodiment of the present disclosure.

Taking a watch as an example, an illustrative structural view of the aforementioned wearable device comprising a watch dial 10 and an array substrate is illustrated in FIG. 5. The circuit wiring of the array substrate is illustrated in FIG. 5. In the array substrate, by providing a plurality of first signal lines 1 having a concentric arc shape and a plurality of second signal lines 2 linearly arranged in the radial direction of the first signal lines 1 on the first surface 11 (solid portion) of the base substrate 9 and providing the first driving circuit 6 connected with the first signal lines 1 on the second surface (dashed portion) and the first driving circuit 6 being electrically connected with the first signal lines 1 by the connecting lines 3, and providing the second driving circuit 7 connected with the second signal lines 2 on the first surface 11, since the first driving circuit 6 and the second driving circuit 7 are both positioned within the display region, the outermost first signal line 1 can have the same diameter as the watch dial 10 which can perform display, the screen proportion of the display region is improved, thereby achieving the narrow bezel design of the wearable device. Of course, the first driving circuit 6 can also be provided on the first surface 11 and the second driving circuit 7 can also be provided on the second surface 12. The present embodiment is only described by way of example.

In the present disclosure, the specific type of display of the wearable device is not restricted, for example, it can be a reflective liquid crystal display, or can comprise an active light emitting display device (e.g., an OLED, a quantum dot light emitting element, and etc.). In both of the above-described cases, providing the driving circuits on the rear face (i.e., the second surface) of the base substrate of the array substrate will not affect the aperture ratio of the array substrate.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510563962.2 filed on Sep. 7, 2015, the disclosure of which is hereby entirely incorporated by reference as a part of the present disclosure.

The invention claimed is:

1. An array substrate comprising:
a base substrate,
a plurality of first signal lines of a concentric arc shape and
a plurality of second signal lines linearly arranged along a radial direction of the first signal lines,
wherein the plurality of first signal lines and the plurality of second signal lines are provided on a first surface of the base substrate, the array substrate further comprising a first driving circuit connected to the respective first signal lines and a second driving circuit connected to the respective second signal lines, the first driving circuit being provided on the first surface or a second surface of the base substrate, and the second driving circuit being provided on the first surface or the second surface.

2. The array substrate according to claim 1, wherein the first driving circuit is provided on the second surface of the base substrate, the array substrate further comprises a plurality of connecting lines provided on the second surface of the base substrate and corresponding to the respective first signal lines, and a plurality of first vias penetrating the base substrate and corresponding to the respective connecting lines, and the first driving circuit is electrically connected to the first signal lines through the respective connecting lines passing through the first vias.

3. The array substrate according to claim 2, wherein an auxiliary circle which is capable of intersecting all of the first signal lines is formed by taking a center of the first driving circuit as a center of the auxiliary circle, and the first vias are disposed in at least one intersection position between the auxiliary circle and the first signal lines.

4. The array substrate according to claim 3, wherein there are two intersection points between each of the first signal lines and the auxiliary circle, and the first vias are provided in both positions of the two intersection points.

5. The array substrate according to claim 4, wherein the connecting lines are extended along a radial direction of the auxiliary circle.

6. The array substrate according to claim 3, wherein the connecting lines are extended along a radial direction of the auxiliary circle.

7. The array substrate according to claim 3, wherein the first driving circuit has an outer profile of circular, a spacing between adjacent two of the plurality of first signal lines is identical, and an included angle between adjacent two of the plurality of second signal lines is identical.

8. The array substrate according to claim 3, wherein the second driving circuit is positioned on the first surface, has a circular-shaped outer profile, and is concentric with the first signal lines.

9. The array substrate according to claim 2, wherein the first driving circuit has an outer profile of circular, a spacing between adjacent two of the plurality of first signal lines is identical, and an included angle between adjacent two of the plurality of second signal lines is identical.

10. The array substrate according to claim 2, wherein the second driving circuit is positioned on the first surface, has a circular-shaped outer profile, and is concentric with the first signal lines.

11. The array substrate according to claim 2, wherein the second driving circuit has a circular-shaped outer profile and is disposed on the second surface, a center of the second driving circuit and a center of the first signal lines have projections on the substrate which are overlapped with each other, and the second driving circuit is electrically connected with the plurality of second signal lines through second vias penetrating the base substrate.

12. The array substrate according to claim 1, wherein the first driving circuit has an outer profile of circular, a spacing between adjacent two of the plurality of first signal lines is identical, and an included angle between adjacent two of the plurality of second signal lines is identical.

13. The array substrate according to claim 1, wherein the second driving circuit is positioned on the first surface, has a circular-shaped outer profile, and is concentric with the first signal lines.

14. The array substrate according to claim 1, wherein the second driving circuit has a circular-shaped outer profile and is disposed on the second surface, a center of the second driving circuit and a center of the first signal lines have projections on the substrate which are overlapped with each other, and the second driving circuit is electrically connected with the plurality of second signal lines through second vias penetrating the base substrate.

15. The array substrate according to claim 14, wherein the second vias are provided at positions where the plurality of second signal lines intersect the second driving circuit.

16. The array substrate according to claim 1, wherein the first driving circuit and the second driving circuit are packaged in Chip On Flex or Chip On Glass.

17. The array substrate according to claim 1, wherein the array substrate further comprises a thin film transistor provided at the respective intersection positions between the first signal lines and the second signal lines on the first surface.

18. The array substrate according to claim 1, wherein the first signal lines are gate lines and the second signal lines are data lines, or first signal lines are data lines and the second signal lines are gate lines.

19. The array substrate according to claim 1, wherein the base substrate is a circular substrate concentric with the plurality of first signal lines.

20. A wearable device, comprising the array substrate according to claim 1.

* * * * *